(12) United States Patent
Groll

(10) Patent No.: US 7,093,340 B2
(45) Date of Patent: Aug. 22, 2006

(54) STICK RESISTANT CERAMIC COATING FOR COOKWARE

(75) Inventor: William A. Groll, McMurray, PA (US)

(73) Assignee: All-Clad Metalcrafters LLC, Canonsburg, PA (US)

( * ) Notice: Subject to any disclaimer, the term of this patent is extended or adjusted under 35 U.S.C. 154(b) by 0 days.

(21) Appl. No.: 10/105,803

(22) Filed: Mar. 25, 2002

(65) Prior Publication Data

US 2003/0022027 A1  Jan. 30, 2003

Related U.S. Application Data

(63) Continuation-in-part of application No. 09/211,749, filed on Dec. 15, 1998, now Pat. No. 6,360,423.

(60) Provisional application No. 60/090,567, filed on Jun. 24, 1998, provisional application No. 60/069,817, filed on Dec. 16, 1997.

(51) Int. Cl.
B23P 25/00 (2006.01)

(52) U.S. Cl. .................. 29/527.4; 29/527.2; 29/527; 29/460

(58) Field of Classification Search .......... 428/472, 428/627, 698, 457; 126/390.1; 220/573.1, 220/573.2; 29/527.2; 72/39, 40, 341; 427/307, 427/329

See application file for complete search history.

(56) References Cited

U.S. PATENT DOCUMENTS

| 3,900,592 | A |   | 8/1975  | Kennedy et al. |
|-----------|---|---|---------|----------------|
| 3,930,806 | A |   | 1/1976  | Racz |
| 3,959,557 | A | * | 5/1976  | Berry |
| 3,977,073 | A |   | 8/1976  | Shirey |
| 4,226,082 | A |   | 10/1980 | Nishida |
| 4,428,811 | A |   | 1/1984  | Sproul et al. |
| 4,450,205 | A |   | 5/1984  | Itaba et al. |
| 4,635,538 | A | * | 1/1987  | Polster |
| 4,774,151 | A |   | 9/1988  | Cuomo et al. |
| 4,839,245 | A |   | 6/1989  | Sue et al. |
| 4,895,765 | A |   | 1/1990  | Sue et al. |
| 4,981,756 | A |   | 1/1991  | Rhandhawa |
| 5,071,693 | A |   | 12/1991 | Sue et al. |
| 5,152,774 | A |   | 10/1992 | Schroeder |
| 5,242,753 | A |   | 9/1993  | Sue et al. |
| 5,264,297 | A |   | 11/1993 | Jindal et al. |
| 5,300,951 | A |   | 4/1994  | Yamazaki |
| 5,352,523 | A |   | 10/1994 | Zurecki et al. |
| 5,368,939 | A |   | 11/1994 | Kawamura et al. |
| 5,372,873 | A |   | 12/1994 | Yoshimura et al. |
| 5,395,680 | A |   | 3/1995  | Santhanam et al. |
| 5,427,843 | A |   | 6/1995  | Miyajima et al. |
| 5,445,892 | A |   | 8/1995  | Riedl et al. |
| 5,447,803 | A |   | 9/1995  | Nagaoka et al. |

(Continued)

FOREIGN PATENT DOCUMENTS

DE 2233 699 A1 1/1973

(Continued)

*Primary Examiner*—Eric Compton
(74) *Attorney, Agent, or Firm*—The Webb Law Firm

(57) ABSTRACT

A method of making a stick resistant cook surface or cooking vessel having the stick resistance in which a hard substrate metal is treated by mechanical buffing/polishing and/or by electropolishing to a high luster surface finish of less than 20 microinches and then coated with a layer of a ceramic nitride, such as zirconium nitride. The electropolishing step is particularly suited for treating non-round shapes or deep drawn cooking vessels having high side walls, such as pots and pans, or square or rectangular shapes which are otherwise difficult to mechanically buff in the interior due to the side wall geometry and/or corners.

7 Claims, 1 Drawing Sheet

U.S. PATENT DOCUMENTS

| | | |
|---|---|---|
| 5,587,227 A | 12/1996 | Ooya |
| 5,663,000 A | 9/1997 | Yamada et al. |
| 5,665,431 A | 9/1997 | Narasimhan |
| 5,670,252 A | 9/1997 | Makowiecki et al. |
| 5,829,116 A | 11/1998 | Vilon |
| 6,197,428 B1 | 3/2001 | Rogers |
| 6,197,438 B1 * | 3/2001 | Faulkner .................... 428/627 |

FOREIGN PATENT DOCUMENTS

| | | | |
|---|---|---|---|
| DE | 31 42 312 A1 | | 5/1983 |
| EP | 0 416 887 A2 | | 9/1990 |
| EP | 0 870 458 A1 | | 3/1998 |
| GB | 1 408 294 A | | 7/1972 |
| GB | 2 277 466 A | | 11/1994 |
| JP | 60-014831 | * | 1/1985 |
| JP | 02-104496 | * | 4/1990 |
| JP | 02-146430 | * | 6/1990 |
| JP | 03-051015 | * | 3/1991 |
| JP | 04-066667 | * | 3/1992 |
| JP | 62-211025 | * | 9/1997 |

* cited by examiner

STICK RESISTANT CERAMIC COATING FOR COOKWARE

CROSS-REFERENCE TO RELATED APPLICATIONS

This application is a continuation-in-part of application Ser. No. 09/211,749 filed Dec. 15, 1998 now U.S. Pat. No. 6,360,423, which claims the benefit of Provisional Application No. 60/069,817 filed Dec. 16, 1997, and Provisional Application No. 60/090,567 filed Jun. 24, 1998.

BACKGROUND OF THE INVENTION

1. Field of the Invention

This invention relates generally to cookware and, more particularly, to cookware having a stick resistant coating applied thereto.

Heretofore, it has been common to apply a lubricative layer of PTFE (polytetrafluoroethylene) to the cooking surface of metal cookware to provide, at least initially, a relatively stick-free surface. Over time, the PTFE loses lubricity and becomes less stick-free or somewhat stick resistant. The PTFE surface is somewhat objectionable because much softer than the metal substrate and is easily scratched and otherwise marred by metal spatulas, forks and other kitchen utensils used for cooking. Once scratched or otherwise marred, the PTFE surface can be chipped off and generally loses its original utility as a stick-free surface.

2. Description of the Related Art

More recently, attempts have been made, as disclosed in UK Patent Application GB 2,277,466A to Tsai, to increase the scratch resistance of PTFE. Other work in the area aimed at improving the hardness and durability of stick resistant coatings for cookware is embodied in U.S. Pat. No. 5,447,803 to Nagaoka et al., which discloses a coating of titanium nitride to steel fry pans. The TiN coating is applied by physical vapor deposition (PVD) or by chemical vapor deposition (CVD) and then heat treated in an atmosphere consisting of oxygen and nitrogen in a controlled ratio to form a protective layer of titanium oxide on the surface of the titanium nitride layer. The titanium oxide layer is said to be hard and, in addition, produces a pleasing golden color to improve the appearance of the fry pan.

Zirconium nitride is a known ceramic coating which has been applied to enhance hardness and wear resistance to various industrial goods such as drill bits, lathe bits and injection molds.

I have discovered that zirconium nitride provides an excellent long-lasting, stick resistant coating for cookware when the substrate metal is properly selected and prepared. In addition, zirconium nitride does not require a separate treatment step to produce an oxide surface as is necessary with prior titanium nitride surfaces. Further, the zirconium nitride coating of my invention provides a pleasing golden color on the cookware which does not discolor when exposed to direct flame, which occurs with titanium nitride coatings. The zirconium nitride coating of the present invention is extremely hard and abrasion resistant, which provides a durable, long-lasting, stick resistant cooking surface, thus making it particularly suitable for restaurant and institutional kitchens. The pleasing gold tone color of the zirconium nitride coating, coupled with its stick resistant properties on the cookware of the present invention, likewise, makes it suitable for the housewares consumer market.

I have also discovered that an improved stick resistant cook surface can be provided when the bare substrate metal is provided with a bright luster finish of less than 20 microinches prior to coating with the ceramic nitride. In my co-pending application Ser. No. 09/211,749, I disclose mechanical polishing and buffing to achieve the bright luster finish. I have now discovered that a further improved stick resistant cook surface of ceramic nitride can be provided if the substrate metal surface is provided with a bright luster finish of preferably less than 10 microinches by electropolishing prior to coating.

The electropolishing step can follow a mechanical buffing step or it can be used in place of the mechanical buffing step, depending on the surface finish of the metal sheet being drawn and the final surface finish desired. As a general rule, electropolishing will reduce the surface finish of the mechanically buffed material by about 50%. The electropolishing step provides additional benefits over the mechanical buffing/polishing step of my parent application. The electropolishing step provides a smoother surface and requires no buffing abrasive compounds or lubricants which are difficult to clean and can be left in the substrate metal in mechanical polishing. These materials can cause poor coating adherence or other coating defects which adversely affect the coated cook surface. In addition, electropolishing can easily be done on the drawn cookware of various shapes. In this manner, cookware of non-round and/or deep drawn shapes can be electropolished which otherwise could not easily be polished/buffed by mechanical means. The present electropolishing step is also beneficial for round shaped cookware because of the cleaner substrate which is free from residual contaminants resulting from the mechanical polishing/buffing operation and the smoother surface finish obtained. Finally, electropolishing is economically advantageous since a plurality of cookware items may be electropolished simultaneously in the same treatment tank.

In addition, I theorize that the substrate surface after electropolishing is in a better condition than a mechanically polished/buffed surface because it has not been mechanically abraded and, thus, is better suited for subsequent ceramic nitride coating. This is due to the fact that electropolishing removes the microscopic high points of metal on the surface rather than moving or wiping the high points of the surface metal in mechanically finished surfaces.

SUMMARY OF THE INVENTION

The present invention is directed to a cooking or baking surface, hereinafter referred to collectively as "cook surface", having a stick resistant coating of a ceramic nitride material, preferably zirconium nitride, thereon. The invention also relates to a method of making the coated cook surface, as well as to the resultant cooking or baking vessels made by the method.

Briefly stated, the cook surface of the invention comprises a hard substrate metal such as stainless steel, carbon steel, titanium or the like, which is conditioned by buffing or electropolishing to a high luster finish of less than 20 microinches, preferably in the range of 2–10 microinches, and still more preferably about 2–5 microinches. The conditioned surface of the substrate metal is cleaned and then coated with a ceramic nitride such as zirconium nitride. There is no need to heat treat the applied coating to produce a protective oxide layer, since zirconium nitride is self-passivating in the atmosphere and, thus, forms a protective layer of zirconium oxide after atmospheric exposure without any special treatment.

The substrate metal of the cooking vessel can be a single layered material or it may be bonded as a clad composite to layers of various other metals such as a conductive core material, for example, copper or aluminum, to promote thermal conductivity. Magnetic layers of ferritic stainless steels may also be included in the composite to make the vessel compatible with induction heating ranges.

When the substrate metal is part of a clad composite of various metal layers, as described above, the zirconium nitride coating is preferably applied by the cathodic arc method known in the art as the physical vapor deposition method (PVD). This method uses a vacuum chamber pressure on the order of $10^{-5}$ Torr at a temperature of about 500°–900° F. This temperature range promotes good coating adhesion while staying below the temperature at which stainless steel and aluminum (forming the clad composite) separate.

According to a preferred method according to the invention, when making deep drawn cooking vessels, such as pots and certain pans, it is difficult to buff or polish the entire interior surface to a bright luster finish. In such circumstances, a presently preferred method of the invention comprises the step of forming a flat blank of the substrate metal, in a clad composite form, if applicable, then buffing the cooking surface of the flat blank to a high luster finish and then drawing the thus-polished blank to a desired shape of the finished vessel. The previously buffed and drawn cooking vessel can then be subjected to an electropolishing step to further improve the surface to a value 50% smoother than the mechanically buffed surface. The shaped vessel is then cleaned and the buffed surface or the buffed and electropolished surface is coated with the zirconium nitride material to provide a stick resistant surface.

According to a preferred method of the invention, a round or non-round drawn or otherwise formed cookware or bakeware shape is electropolished to a high luster finish and subsequently coated with a ceramic nitride material, such as zirconium nitride, to provide a stick resistant surface. After electropolishing, the surface roughness Ra is preferably in the range of about 2–10 microinches, more preferably 3–8 microinches, and still more preferably 2–5 microinches.

These features, as well as other advantages and attributes of the invention, will become more readily apparent when reference is made to the drawings when taken with the following detailed description.

DETAILED DESCRIPTION OF THE INVENTION

With reference to the drawings, a multi-layer, or -ply, clad metal composite cook surface of the invention, generally designated by reference number 2, is shown. A single layer cook surface 4 is depicted in FIG. 2, which is also suitable in the practice of the present invention.

Figure 1:
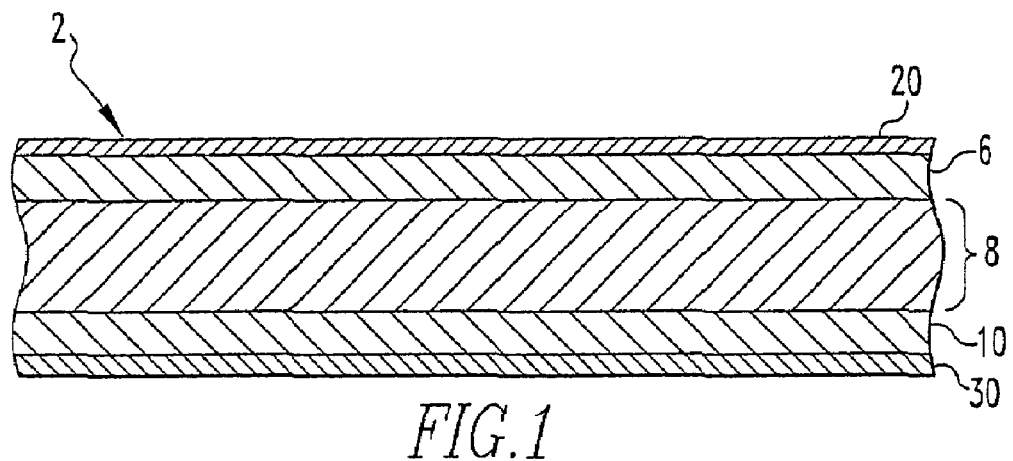
FIG. 1 is an enlarged cross-sectional side view of a clad metal composite of a stick resistant cook surface according to the present invention.

The multi-ply composite 2 of FIG. 1 having a stick resistant layer 20 thereon may comprise a substrate metal layer 6 at the cook surface of, for example, stainless steel, such as 304 grade. A heat conductive core layer 8 of Alclad Aluminum or copper or copper alloy is bonded to the substrate metal layer 6 and an exterior layer 10 of stainless steel is bonded to the core layer 8. The exterior layer 10 may be a 304 grade stainless steel or it may be a magnetic or ferritic grade 436, making the composite 2 suitable for use on an induction heating range, as well as a conventional gas or electric radiant heating range.

The multi-ply composite 2 of FIG. 1 may also represent a flat griddle plate wherein the substrate metal layer 6 and exterior layer 10 are of stainless steel and the core layer 8 is copper or copper alloy. The zirconium nitride stick resistant layer 20 provides excellent properties for a commercial griddle plate.

Figure 2:
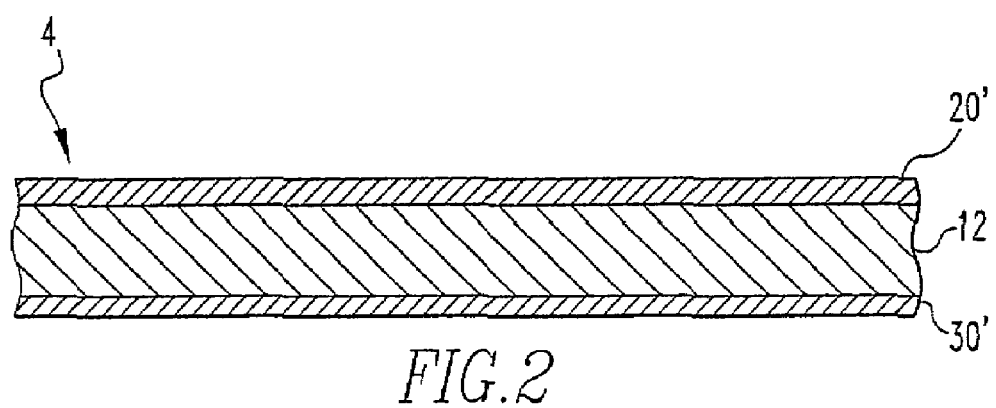
FIG. 2 is a view similar to FIG. 1 but merely showing a single substrate metal layer having a stick resistant cook surface according to the present invention.

The substrate metal layer 12 of FIG. 2 forms the entire cross section of the cook surface and may be in the form of a griddle plate, grill grate or other cookware. It is well-known, however, in the cooking art that multi-ply composite metals having high thermal conductivity cores, of the type depicted in FIG. 1, offer superior cooking performance when used in cooking vessels such as pots, pans and oven bakeware.

The substrate metal layers 6 or 12 must be highly compatible with the thermal expansion properties of the stick resistant layer 20 of zirconium nitride of FIG. 1 or 20' of FIG. 2. Otherwise, the zirconium nitride coating will not adhere properly. The substrate metal layer should also be a hard metal. Preferred substrate metals include titanium or any of a wide variety of grades of stainless steel, including the above grades 304 and 436. A soft material such as aluminum or copper should be avoided for use as a substrate metal layer 6 or 12.

In order to provide superior stick resistant properties, the interior surface, i.e., the substrate metal layer 6 or 12, must be finished by fine polish grinding preferably followed by buffing to a high surface smoothness, providing a bright luster finish. Sequentially following buffing or, alternatively, the substrate metal layer 6 or 12 may be finished by electropolishing, as will be discussed below. As the substrate metal surface smoothness increases by mechanical and/or electropolishing, the stick resistant properties of the stick resistant layer 20 and 20', likewise, increase. The surface preparation when using mechanical finishing preferably involves a two-step grinding operation carried out on a commercial device, known as a Hi-Lite brand buffing machine, using a 180 grit alumina abrasive paper flooded with a petroleum based lubricant. A stationary nose of the machine carries the abrasive while the metal substrate is spun at speeds of 500 to 1,000 rpm. The nose carrying the abrasive traverses the spinning metal two times. The metal is then further treated using a finer abrasive of 220 grit using the same machine parameters as above, also employing a double traverse. The treated surface has a bright luster finish of less than 20 microinches and preferably 10–16 microinches, more preferably, an ultra bright surface finish of 2–6 microinches with a surface smoothness of 3 microinches being superior. It is, of course, understood that a higher luster surface requires additional polishing with a buffing wheel and medium buffing abrasive which adds some additional cost to the finished cookware. Thus, a compromise between added cost and added stick resistance must be made in a commercial setting. Still further improvements in surface smoothness and cook surface performance are realized by electropolishing the cook surface prior to applying the stick resistant nitride layer.

The applied zirconium nitride forming stick resistant layer 20, 20' provides a cosmetically pleasing gold color to the cookware and, thus, in addition to the stick resistant layers 20, 20', the zirconium nitride may be applied as an exterior decorative layer 30 and 30', FIGS. 1 and 2, respectively. The exterior surfaces of the underlying exterior metal layer need not be buffed to the high degree of smoothness required on the cook surface since stick resistance is not required on the exterior surfaces of the cooking vessel. Of course, it is understood that the zirconium nitride can be applied to selected surfaces of the cookware to achieve any desired appearance, simply by masking those surfaces which are not to be coated. These masking techniques are well-known in the coating art.

A high degree of surface cleanliness is required prior to coating the metal substrate layer. Any uncleaned dirty areas will act as a mask and prevent proper adhesion of the layers 20, 20', 30, 30'. The surface is cleaned with a detergent and rinsed with deionized water after the buffing/polishing treatment, then later cleaned further in an ultrasonic bath.

Many of the problems encountered in thoroughly cleaning the substrate surface following mechanical polishing/buffing are overcome by the electropolishing step of the present invention. In addition to providing a smoother, cleaner substrate surface, electropolishing also permits the surface treatment of non-round, previously drawn cookware shapes, such as square, rectangular, and oval shapes, which are difficult to mechanically polish in the corner regions. The resulting surface roughness, Ra, is much smoother after electropolishing than in mechanically finished surfaces. Electropolishing can generally lower the Ra value of a mechanically finished surface by approximately 50%. The details of the electropolishing operation are well known and commonly used in the semiconductor, food processing, chemical and tool and die art, for example, in applying ultra smooth finishes to complex products and tooling shapes and in electromachining. The cookware or bakeware (collectively "cookware") to be electropolished is placed into a treatment tank containing a conventional electrolytic solution. The electrodes are installed on the negative side of the power source and placed in spaced proximity to the cookware substrate surfaces to be treated and a direct current is applied. The cookware is fixed to the positive side of the power source and acts as the anode. Metal from the surface of the substrate is removed ion by ion by virtue of the electrolytic action and an ultra smooth surface finish is achieved, including the heretofore difficult-to-reach corner areas. The details of operating the electropolishing process are well known to those skilled in the art and need not be explained in any great detail. The so-treated cookware is then removed from the electropolishing apparatus, cleaned, rinsed and dried. The treated surface is then coated with a ceramic nitride material, such as titanium or zirconium nitride as described below.

It is interesting and informative to compare a mechanically buffed surface having a mirror finish with an electropolished surface. To the unaided eye, a mechanically buffed surface often appears the same as the electropolished surface. This is complicated by the fact that both surface finishes can produce the same profilometer readings in Ra or RMS. However, photomicrographs of the mechanically buffed surface and the electropolished surface reveal fundamental differences between the two surfaces. The electropolished surface appears to be featureless while the buffed surface exhibits layers of smeared, disturbed and damaged metal as well as embedded residual abrasives and buffing compounds. I believe that the electropolished cookware surface after coating with a ceramic nitride exhibits improved stick resistance and improved adherence to the substrate compared with a comparably coated buffed surface by virtue of the improved surface metallurgy provided by electropolishing.

The zirconium nitride applied to the cooking vessel is done by the cathodic arc method also known as the physical vapor deposition method (PVD). In the case of cladded material, the PVD method is employed. This method uses a vacuum chamber pressure of about $10^{-5}$ Torr and a temperature of 500°–900° F. This temperature range promotes good coating adhesion while staying under the temperature at which the stainless steel and aluminum layers in the clad composite would separate. The parts to be coated are first cleaned with a plasma bombardment of an inert gas. This initial bombardment activates the surface by reducing the surface oxide. The zirconium is then vaporized and a layer which is several angstroms thick is deposited on the surface. A nitrogen atmosphere is then introduced and the zirconium nitride ceramic of layer 20, 20' or 30, 30' is built. The cycle is completed when a measured amount of oxygen is introduced into the chamber and a zirconium oxide layer is formed. A coating thickness of one and one-half to three microns is achieved for layer 20, 20'. A preferred thickness for a stick resistant layer of zirconium nitride is two microns.

Zirconium nitride offers a number of significant advantages over the known titanium nitride material. The zirconium nitride can be applied to a substrate at a lower temperature range than that required for titanium nitride. This is particularly beneficial in the case of bonded metals which separate or distort at higher temperatures. In addition, titanium nitride can react galvanically with the substrate, causing surface degradation, discoloration and corrosion. Because of a higher deposition rate, zirconium is more economical to apply. Zirconium exhibits a self-passivating characteristic which tends to prevent galvanic current paths from forming. U.S. Pat. No. 5,447,803 of Nagaoka et al. teaches a final back flushing of oxygen to stabilize the surface with a layer of titanium oxide. This layer can be chemically or abrasively damaged, which leaves the titanium/substrate system susceptible to galvanic corrosion.

In conclusion, zirconium nitride, when applied as a surface coating to cookware, bakeware, grills, griddles or other food preparation surfaces, offers: (a) a high durable wear resistance; (b) high corrosion resistance; and (c) substantial resistance to sticking of foods to the surface.

Zirconium nitride is superior to PVD or CVD deposited titanium nitride for the following reasons: (a) zirconium nitride can be applied at a lower temperature than titanium nitride; (b) zirconium nitride is self-passivating, which offers superior corrosion resistance. Titanium nitride has far less tendency to form an oxide after the initial coating treatment; and (c) zirconium nitride can be applied more economically than titanium nitride. Thus, zirconium nitride offers a superior stick resistant layer 20, 20' over the previously proposed titanium nitride coatings of the prior art.

I have found that it is difficult to uniformly mechanically buff the bottom cooking surface of deep drawn cookware, such as pots, when applying an ultra high luster finish (2–4 microinches), since the high walls of the vessel interfere with the entry of the buffing wheel. Accordingly, in the manufacture of deep drawn cookware, according to the present invention, I have found it advantageous to first polish and buff the flat metal blank to a smooth, high or ultra high luster finish prior to subjecting the blank to a drawing operation for forming the cookware vessel. The polished/buffed surface of the blank remains substantially undisturbed during the drawing operation and may then be coated with titanium nitride (after appropriate cleaning). Of course, the above-described electropolishing step is also suitable for treating deep drawn cookware (after drawing) so as to obviate the need for mechanically polishing/buffing flat blanks to the very smooth surface finish desired.

Comparative Tests

Test I—Surface Smoothness

A first multi-ply cladded fry pan comprising an interior substrate metal layer (cook surface) of 304 stainless steel, a core layer of Alclad aluminum and an exterior surface layer of 436 stainless steel was made in a conventional manner and then subjected to the titanium nitride coating process. Before coating, the exterior surface of the fry pan was buffed to a bright luster and the interior surface was finished with a concentric pattern known in the industry as a "Hi-Lite" finish using a lubricated 150 grit abrasive. A second fry pan of the same size and multi-layer clad composition was made and then aggressively buffed using a hard cloth buff wheel and a medium buffing compound on the interior and exterior surfaces, bringing both surfaces to an ultra high reflective luster finish of about 3 microns and then subjected to the same titanium nitride coating process as the first fry pan. Both coated pans were compared to an uncoated multi-ply stainless steel third fry pan in a standard objective test, which involved burning a measured sample of brown sugar and water on the cook surface of the fry pans. Both the first and second titanium nitride coated pans clearly exhibited better release properties than the bare, uncoated multi-ply stainless steel third fry pan. However, the second fry pan that had the higher luster buffed interior prior to titanium nitride coating showed better release characteristics than the abrasively finished first fry pan. A buffed, bright luster surface finish suitable for subsequent titanium nitride coating in accordance with my invention, thus preferably has a surface smoothness of about 3 microinches. By way of comparison, the surface finish of the above-mentioned "Hi-Lite" finish had a surface smoothness on the order of about 9–12 microinches.

This comparative test thus demonstrates that a smoother surface on the substrate layer provides improved stick resistance properties in the ceramic nitride layer.

Test II—Egg Cooking Cleanup

A standard ten-inch diameter stainless steel-aluminum core-stainless steel fry pan was tested against an identically constructed pan but having a 1.5 micron thick coating of zirconium nitride on the stick resistant layer 20 and also applied on the exterior surface 30. A release additive, Pam®, was sprayed briefly on each pan and an egg was then fried in each. After cooking, the pans were cleaned using a scrub pad and rated with an assigned value of 1 to 5, with 1 being rated the best and 5 the worst. Five cooking trials were run on each pan. The stainless steel standard fry pan rated an average 3 in cleanability while the zirconium nitride coated stainless pan rated an average 1.2, which is considered excellent and actually equivalent to a new, non-stick PTFE surface.

Test III—Coating Thickness

The purpose of this test was to find out how well the release properties of the ZrN of various thicknesses hold up with use.

The experiment tested the release properties of two stainless steel aluminum core fry pans having different thicknesses of zirconium nitride thereon. The first pan had 0.56 microns of ZrN while the second pan had a 2 micron thick layer of ZrN thereon. The pans were put through a baked bean scrape/wash test. One tablespoon of Bush's Best Baked Beans was placed in the center of each pan and heated until all of the syrup had turned into a black residue. Then a spoon was dragged across the burnt beans. The success of the scrape was recorded on a scale of 1 to 5 as follows:

1=All beans come off the pan with the scrape
2=Beans flake off in large chunks
3=Beans are removed from the path of the spoon only
4=Most, but not all, beans are removed from the path of the spoon
5=No beans are removed.

After recording the value for the scrape, the pan was soaked for one minute in hot water and Palmolive® dish detergent. After soaking, the pan was washed with a scrubbing pad and another rating was assessed using the same scale. Some of the tests left a silver stain on the pan. A scrubbing and polishing compound, Bar Keeper's Friend®, was used to remove the stain, so it would not be confused for a weak area in the coating.

The first pan tested having a ZrN coating thickness of 0.5 microns failed in its stick resistant properties after ten trials and bare stainless began to appear along the cook surface. The second pan tested, having a zirconium nitride layer of 2 microns in thickness, successfully completed 60 trials without failure.

The scrape test and soak/cleaning test results for the second pan are set forth below in tables (a)–(c) covering bean cooking trials 1–60.

| Baked Beans Scrape/Wash Test on Batch 4 Pan 3 Trials | | |
|---|---|---|
| Trials | Scrape | Wash |
| (a) | | |
| 1 | 4 | 2 |
| 2 | 3 | 4 |
| 3 | 3 | 2 |
| 4 | 3 | 2 |
| 5 | 4 | 1 |
| 6 | 4 | 1 |
| 7 | 4 | 1 |
| 8 | 4 | 1 |
| 9 | 4 | 1 |
| 10 | 4 | 1 |
| 11 | 3 | 2 |
| 12 | 3 | 3 |
| 13 | 4 | 1 |
| 14 | 4 | 1 |
| 15 | 3 | 2 |
| 16 | 3 | 2 |
| 17 | 3 | 1 |
| 18 | 3 | 2 |
| 19 | 4 | 1 |
| 20 | 3 | 2 |
| (b) | | |
| 21 | 3 | 1 |
| 22 | 4 | 2 |
| 23 | 3 | 2 |
| 24 | 4 | 1 |
| 25 | 3 | 3 |
| 26 | 4 | 2 |
| 27 | 3 | 1 |
| 28 | 3 | 2 |
| 29 | 4 | 1 |
| 30 | 3 | 3 |
| 31 | 4 | 3 |
| 32 | 5 | 3 |
| 33 | 5 | 3 |
| 34 | 4 | 3 |
| 35 | 4 | 3 |
| 36 | 4 | 2 |
| 37 | 3 | 2 |
| 38 | 3 | 3 |

-continued

Baked Beans Scrape/Wash Test on Batch 4 Pan 3 Trials

| Trials | Scrape | Wash |
|---|---|---|
| 39 | 5 | 3 |
| 40 | 5 | 3 |
| | (c) | |
| 41 | 4 | 4 |
| 42 | 5 | 2 |
| 43 | 4 | 3 |
| 44 | 4 | 3 |
| 45 | 4 | 3 |
| 46 | 4 | 2 |
| 47 | 4 | 3 |
| 48 | 4 | 3 |
| 49 | 3 | 3 |
| 50 | 5 | 3 |
| 51 | 4 | 4 |
| 52 | 4 | 3 |
| 53 | 4 | 3 |
| 54 | 3 | 2 |
| 55 | 4 | 4 |
| 56 | 4 | 4 |
| 57 | 4 | 2 |
| 58 | 4 | 3 |
| 59 | 4 | 3 |
| 60 | 4 | 4 |

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the appended claims and any and all equivalents thereof.

I claim:

1. A method for making a cook surface comprising the steps of:
   providing a substrate metal layer selected from the group consisting of stainless steel, carbon steel and titanium wherein said substrate metal layer has a layer of a high heat conductivity metal bonded thereto selected from one of aluminum and copper and defining a clad composite;
   mechanical buffing the substrate surface;
   electropolishing the substrate surface to form a bright luster finish on said substrate surface, wherein said electropolishing step provides a surface smoothness value Ra on the order of about 50% less than a smoothness value of the substrate after the mechanical buffing step;
   cleaning the substrate; and
   applying by PVD a coating of zirconium nitride to the bright luster finished substrate surface at a temperature between 500°–900° F. (260°–482° C.), whereby no separation occurs between the layers of the clad composite.

2. The method of claim 1, wherein the cook surface is used in a cooking device selected from the group consisting of stove-top cookware, oven bakeware, griddle plates and grill surfaces.

3. The method of claim 1, wherein the cook surface is used in one of a stove-top cookware vessel and an oven bakeware vessel, wherein said vessels having a layer of said zirconium nitride applied on at least an inner cooking or baking surface and on at least selected outer surfaces of said vessels.

4. The method of claim 1 wherein the substrate metal forms an outer layer of a multi-layered metal composite.

5. The method of claim 1 wherein the cook surface is one of a fry pan, saucepan, saucier, casserole, saute pan, stock pot, brazier pan, stir fry pan and omelet pan.

6. The method of claim 1, wherein the cook surface is an oven baking utensil wherein the stainless steel substrate has a surface finish of 2–4 microinches prior to being coated with said layer of zirconium nitride.

7. The method of claim 1 wherein said stainless steel substrate has a surface finish of less than 1 microinches prior to coating with zirconium nitride.

* * * * *

UNITED STATES PATENT AND TRADEMARK OFFICE
CERTIFICATE OF CORRECTION

PATENT NO. : 7,093,340 B2  Page 1 of 1
APPLICATION NO. : 10/105803
DATED : August 22, 2006
INVENTOR(S) : Groll It is certified that error appears in the above-identified patent and that said Letters Patent is hereby corrected as shown below:

Column 10, Line 40, Claim 7, "1 microinches" should read -- 5 microinches --

Signed and Sealed this

Twenty-sixth Day of December, 2006

JON W. DUDAS
*Director of the United States Patent and Trademark Office*